United States Patent
Meyers et al.

(10) Patent No.: US 6,771,096 B1
(45) Date of Patent: Aug. 3, 2004

(54) CIRCUIT, SYSTEM, AND METHOD FOR USING HYSTERESIS TO AVOID DEAD ZONE OR NON-LINEAR CONDITIONS IN A PHASE FREQUENCY DETECTOR

(75) Inventors: Steve Meyers, Round Rock, TX (US); Nathan Moyal, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/105,687

(22) Filed: Mar. 25, 2002

(51) Int. Cl.⁷ .............................................. G01R 25/00
(52) U.S. Cl. .............................. 327/3; 327/156; 331/25
(58) Field of Search ................................ 327/2, 3, 5, 7, 327/8, 12, 146–148, 155–157, 162, 163; 331/1 A, 25, DIG. 2; 375/373–376

(56) References Cited

U.S. PATENT DOCUMENTS

| | | | |
|---|---|---|---|
| 4,970,475 A | * 11/1990 | Gillig ............................ | 331/25 |
| 5,736,872 A | * 4/1998 | Sharma et al. .................. | 327/3 |
| 5,892,380 A | * 4/1999 | Quist .......................... | 327/172 |
| 5,963,058 A | 10/1999 | Thomas ........................ | 327/3 |
| 5,963,059 A | 10/1999 | Partovi et al. ................. | 327/12 |
| 6,049,233 A | * 4/2000 | Shurboff ........................ | 327/2 |
| 6,147,561 A | 11/2000 | Rhee et al. .................... | 331/12 |
| 6,192,094 B1 | 2/2001 | Herrmann et al. .......... | 375/375 |
| 6,285,219 B1 | * 9/2001 | Pauls ............................ | 327/3 |

* cited by examiner

*Primary Examiner*—Minh Nguyen
(74) *Attorney, Agent, or Firm*—Kevin L. Daffer; Conley Rose P.C.

(57) ABSTRACT

A phase frequency detector (PFD) utilizes hysteresis dead zone avoidance while maximizing the linear range and minimizing the power and area consumed by the PFD circuit. The PFD includes a hysteresis in a reset logic gate, which prevents the reset logic gate from switching its output before each of the corrective pulses from the PFD reach final steady state DC voltage values. The PFD response simulates an ideal response, such that linearity is maintained at the phase lock point and throughout a linear range of $+/-2\pi$. In addition, the hysteresis reset logic gate monitors the corrective pulses to insert an appropriate amount of time delay into the PFD reset path without introducing additional delay elements. As a result, the linear range of the PHD is maximized and the power and area consumed by the PFD is minimized, due to the fact that additional delay elements are eliminated from the design.

19 Claims, 6 Drawing Sheets

CIRCUIT, SYSTEM, AND METHOD FOR USING HYSTERESIS TO AVOID DEAD ZONE OR NON-LINEAR CONDITIONS IN A PHASE FREQUENCY DETECTOR

BACKGROUND OF THE INVENTION

1. Field of the Invention

This invention relates to a phase-locked loop circuit and, more particularly, to a phase frequency detector within a phase-locked loop circuit that imparts hysteresis into a reset signal to avoid dead zone and other non-linear problems associated with conventional phase frequency detectors.

2. Description of the Related Art

The following descriptions and examples are given as background only.

Phase-locked loop ("PLL") circuits are typically used for frequency control. As such, PLL circuits are routinely used for data and telecommunications, frequency synthesis, clock recovery, and similar applications. A PLL circuit is often used as a frequency synthesizer, or clock generator. Most clock generators use one or more phase-locked loops to generate one or more different frequencies from one or more reference sources. A reference frequency is usually generated by a reference clock attached to the frequency synthesizer. Ideally, frequency synthesis results in one or more clocking devices that are in phase alignment with the reference clock.

A PLL circuit typically includes four main components: a phase frequency detector ("PFD"), a filter, a voltage controlled oscillator ("VCO"), and a frequency divider. The PLL circuit is arranged to receive a reference clock signal from a reference source. The phase frequency detector is configured to compare the reference clock signal to a feedback clock signal generated by components within the PLL circuit. In particular, the PFD is configured to detect differences in frequency and/or phase between the reference and feedback clock signals, and to generate compensating "up" and "down" signals depending on whether the feedback clock signal is lagging or leading the reference clock signal in frequency or phase. The up/down control signals may be passed through a filter to integrate the control signals into a control voltage, which may be sent to the VCO. The VCO may then convert the voltage information from the up/down control signals into an output signal, which preferably contains frequency and/or phase information. The VCO output signal may be sent back to the PFD via a feedback loop.

In this manner, the PLL circuit is configured to produce a feedback clock signal, which is in phase alignment (i.e. zero phase offset) with the phase of a reference clock signal. If phase alignment is not present, the PFD generates an error signal in the form of the up/down control signals to correct the phase-misalignment. Ideally, the PFD produces an error signal (or, net charge), which is a linear function of the phase offset measured between the reference and feedback signals. As shown in the idealized PFD charge versus phase plot of FIG. 1, a linear relationship may exist between the PFD phase offset and the net charge between about +/-2π (i.e., +/-6.28 radians). A zero net charge may also exist when the phase offset is zero (i.e. when reference and feedback phases are substantially aligned). Thus, the PLL is said to be in frequency and phase "lock" when operating at zero phase offset, or approximately 0.0 Coulombs (Cb), as shown in FIG. 1.

However, when the two input signals differ in phase by more than about 2π radians, the output signal may have a negative net charge when the feedback clock signal occurs more often (i.e., when the feedback clock signal has a higher frequency), and a positive net charge when the reference clock signal occurs more often (i.e., when the reference clock signal has a higher frequency). In this manner, the PFD may deliver a negative net charge, or "pump down" pulse, when the feedback clock signal leads the reference clock signal, and a positive net charge, or "pump up" pulse, when the feedback clock signal lags the reference clock signal. Therefore, the error signal output from the PFD may drive the system to a zero phase offset even when the frequencies of the reference and feedback clocks are different.

Many conventional PLL circuits suffer from non-ideal characteristics, which may cause the response of an actual PFD circuit to deviate from the ideal response illustrated in FIG. 1. Non-ideal characteristics are illustrated in the non-idealized PHD charge versus phase plot of FIG. 2 and may include, for example, decreased linear range and PFD dead zone. The linear range of the PFD may be defined as the region in which a change in phase results in a linear change in net charge delivered to the PLL. Ideally, the linear range of the PFD extends between about +/-2π, shown as range 10 in FIG. 1. In practice, however, non-zero gate delays and other timing factors may decrease the actual linear range. FIG. 2, for example, illustrates the response of a conventional PFD, which exhibits a decreased linear range extending between approximately +/-1.5π (represented by range 20). Decreasing the range in which the PFD is monotonic (i.e. linear) may result in a reduced tracking range and pull-in range, and may also increase lock acquisition time. Thus, it may be important to keep the minimum linear range greater than about +/-π, due to the inability of the PHD to acquire frequency lock within this range, since the net charge will not correspond to the frequency offset. For example, the PFD may generate the wrong direction (i.e. opposite net charge) for more than half of a +/-2π range if the linear range is less than +/-π. Preferably, a practical minimum linear range may be about +/-4π/3.

Another problem common to conventional PLL circuits, known as the "dead zone," is illustrated in the non-idealized PFD charge versus phase plot of FIG. 3 as range 30. The dead zone includes a narrow frequency band in a region near the phase lock point (i.e. at zero phase offset). Within this narrow phase region, the reference and feedback signals are so close in phase that there may not be enough time for the PFD corrective output pulses to fully switch so that the charge pump can determine the correct phase error value. Once the phase offset drifts out of this phase region, the PFD may start properly correcting again. However, the dead zone tends to reduce the PLL gain at the phase lock point, and thus "deadens" the response.

The PFD circuits described in early literature appear to attribute the dead zone response, such as that shown in FIG. 3, to large jitter or wandering phases at the lock point. Jitter is a problem common in almost all high-speed synchronous systems, and may occur when a signal deviates in phase or frequency from that of an ideal clock. Jitter, however, may not be the cause of the dead zone problem. The actual cause of the problem may have been previously unknown due to the common misconception that all PLLs had to live with the effects of the dead zone. In an effort to avoid the dead zone, less than desirable fixes were used to reduce the dead zone effects to more tolerable levels. In one example, a current leaking resistor was added to the low pass filter of the PLL circuit to "pull" the PLL out of the dead zone. Though the addition of a leakage resistor did result in reducing jitter, it also introduced a large and variable phase offset, which made it difficult to achieve zero phase lock. Thus, the inability of conventional PLL circuits to achieve a zero phase offset with the reference clock signal may be one disadvantage of previous methods.

Therefore, it may be desirable to provide an improved PFD having a response that closely follows an ideal phase offset response. As such, it may be desirable to provide an improved PFD that avoids the dead zone problem, while maximizing the extent of the linear range. It may further be desirable to provide an improved PFD that offers lower power and smaller area than currently available PFDs.

SUMMARY OF THE INVENTION

The problems outlined above may be in large part addressed by a PFD, alternatively known simply as a detector, which avoids the dead zone problem while maximizing the linear range and minimizing the power/area concerns of currently available PFDs. As such, the phase frequency detector described herein includes a reset logic gate having a hysteresis input. Including hysteresis in the reset logic gate helps prevent the reset logic gate from switching its output response before corrective output pulses (i.e., pump up and pump down pulses) from the PFD transition to final steady state voltage values.

The phase frequency detector preferably has a linear response at the zero phase offset, or phase lock point, and sustains linearity throughout the entire linear range. In addition, the hysteresis logic gate monitors the corrective output pulses to insert an appropriate amount of time delay into the reset path without introducing additional delay elements. Inappropriate use of delay elements would contribute an arbitrary amount of delay, which may vary with process and could be more than the amount needed by an actual PFD circuit. By including hysteresis in the reset logic gate, however, the linear range of the present PFD is maximized by not taking more delay (or reset time) than is actually needed by the PFD output. Avoiding conventional delay elements (which introduce inappropriate delay amounts) also avoids the additional power consumption of those elements and minimizes the area needed to implement the PFD.

According to one embodiment, a phase frequency detector is described herein as including a first and second latch, where each latch includes a reset input, a clock input, and a pulse output upon which pump up and pump down pulses are produced. In addition, the PFD circuit may include a pair of input conductors adapted to receive a reference clock signal and a feedback clock signal. The reference clock signal may have a reference frequency and phase and the feedback clock signal may have a feedback frequency and phase. As such, a clock input of the first latch may be adapted to receive the reference clock signal, while a clock input of the second latch may be adapted to receive the feedback clock signal. In response to a phase difference between the reference and feedback clock signals, the second latch may generate a first corrective output pulse upon a first output conductor when the phase of the feedback signal "leads" the phase of the reference signal. In this manner, the first output conductor is adapted to receive a pump down signal that transitions to a logic high voltage value if a leading edge of the feedback clock signal precedes a leading edge of the reference clock signal. Alternatively, the second latch may generate a second corrective output pulse upon a second output conductor when the phase of the feedback clock signal "lags" the phase of the reference clock signal. Thus, the second output conductor is adapted to receive a pump up signal that transitions to a logic high voltage value if the leading edge of the feedback clock signal follows the leading edge of the reference clock signal.

The PFD may further include a reset path coupled between the first and second output conductors and reset inputs of the first and second latches. Arranged within the reset path is a reset logic gate having hysteresis, which is used to generate a time delay output signal (otherwise referred herein as a "reset signal"). In this manner, the reset logic gate is coupled to forestall transition of the pump down signal to a logic low voltage value until after the transition of the pump up signal reaches a steady state logic high voltage value for each cycle of the reference clock signal. Alternatively, the logic gate is further coupled to forestall transition of the pump up signal to a logic low voltage value until after the transition of the pump down signal reaches the steady state logic high voltage value for each cycle of the feedback clock signal. Thus, the reset logic gate avoids setting the first and second latches to a reset state until the each of the corrective output pulses substantially reach steady state DC voltage values. As such, the reset logic gate is configured to introduce an appropriate amount of delay without adding delay elements to the reset path of the PFD circuit.

According to another embodiment, a PLL circuit is provided herein. In general, the PLL circuit includes a PFD circuit, which as described above, produces a pump down signal if the detector receives a feedback clock signal before receiving a reference clock signal and forestalls termination of the pump down signal until after a pump up signal achieves a steady state voltage value. In addition, the PFD produces a pump up signal if the detector receives a feedback clock signal after receiving a reference clock signal, and forestalls termination of the pump up signal until after a pump down signal achieves a steady state voltage value. The PLL circuit further includes a charge pump, filter, voltage-controlled oscillator, and feedback frequency divider. The charge pump may be configured to subtract the duration of the pump down signal and the pump up signal and produce a net voltage value that controls the feedback clock signal to match in frequency or phase the reference clock signal. As such, the PLL circuit may receive a reference clock signal from a reference source and may generate an output signal, which may be in phase alignment with the reference clock signal. Optionally, a reference frequency divider may divide the frequency of the reference clock signal to allow the use of higher frequency reference sources or, alternatively, to produce high-frequency phase-locked outputs.

Furthermore, a method for reducing the dead zone of a circuit, which detects a phase or frequency difference between a reference clock signal and a feedback clock signal, is also contemplated. Such a method may include receiving a reference clock signal having a reference clock frequency and phase, and a feedback clock signal having a feedback frequency and phase. The method may also include generating corrective output pulses (i.e., pump up or pump down pulses) depending on whether the feedback clock signal lags or leads, respectively, the reference clock signal. The corrective output pulses may be supplied to a reset logic gate arranged within the reset path of the PFD. The reset logic gate monitors the corrective output pulses and generates a new time delay output signal (i.e., a new reset signal) when the corrective output pulses substantially equal steady state DC voltage values. In this manner, the steady state voltage values of the corrective output pulses are achieved before initiating a reset condition upon a pair of latches that produce the corrective output pulses. Such achieving may impart an amount of delay in the output of the reset logic gate that feeds the reset inputs of the pair of latches. The delay may occur for each cycle of the reference clock signal (when the feedback clock signal lags the reference clock signal) or for each cycle of the feedback clock signal (when the feedback clock signal leads the reference clock signal).

BRIEF DESCRIPTION OF THE DRAWINGS

Other objects and advantages of the invention will become apparent upon reading the following detailed description and upon reference to the accompanying drawings in which.

Figure 1:
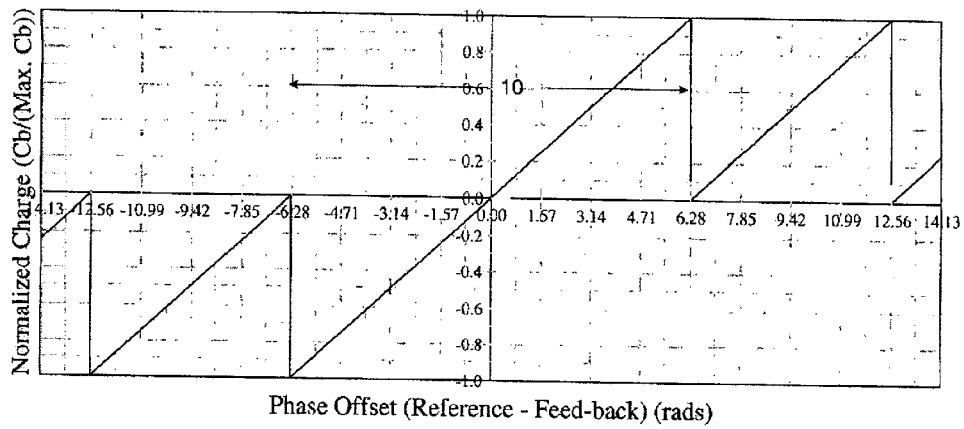
FIG. 1 illustrates an ideal response of a phase frequency detector circuit.
Figure 2:
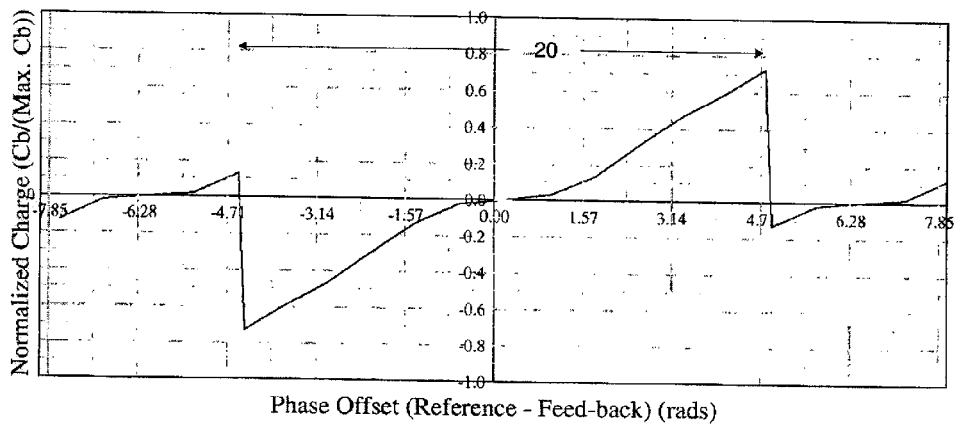
FIG. 2 illustrates a non-ideal response of a conventional phase frequency detector circuit emphasizing a decreased linear range.
Figure 3:
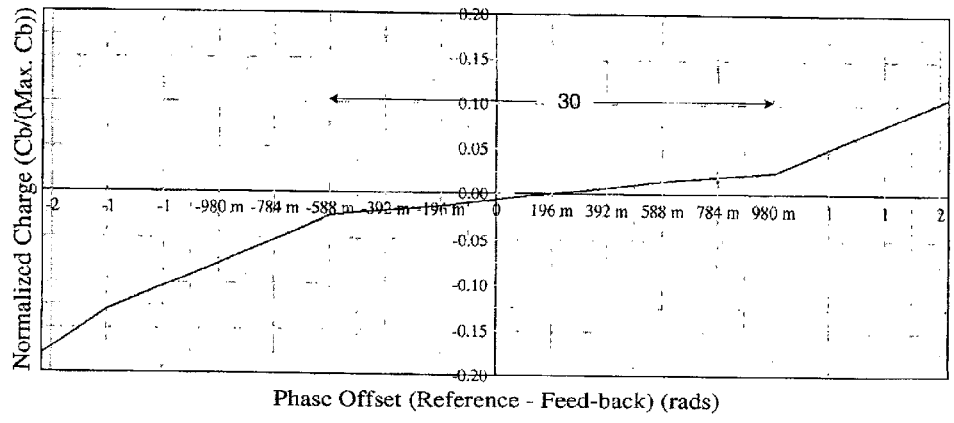
FIG. 3, a blown-up view of FIG. 2, emphasizes the dead zone problem typical of conventional phase frequency detector circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
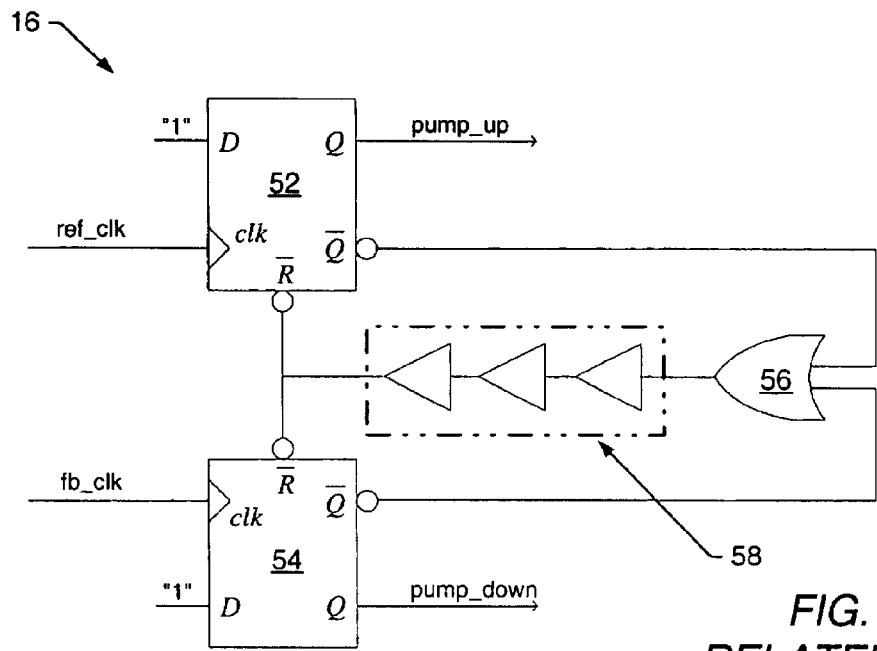
FIG. 4 illustrates one embodiment of a phase frequency detector that reduces the dead zone by adding delay elements in the reset path of the PFD.

FIG. 4 illustrates one embodiment of a conventional phase frequency detector 16 that may be used in PLL circuit 11, as described below and shown in FIG. 10. Such an embodiment is a positive edge-triggered PFD, and may include two D-type flip-flops ("DFF") with data inputs tied to a logic high ("1") voltage value. The reference clock signal ("ref_clk") is used to latch the logic high voltage value upon the output of DFF 52, while the feedback clock signal ("fb_clk") is used to latch the logic high voltage value upon the output of DFF 54. When either DFF is clocked, the clocked DFF outputs a corresponding corrective output signal ("pump_up" or "pump_down") to the filter and VCO of PLL circuit 11 to either speed up or slow down the internal clock. In this manner, if the fb_clk transitions before the ref_clk (provided the D input remains at a logic high value), the voltage sent to the VCO is reduced via the charge pump and the internal clock is slowed. Alternatively, if the fb_clk is lagging, or phase retarded relative to the ref_clk, the voltage sent to the VCO is increased via the charge pump to speed up the internal clock. Once both corrective output pulses have been asserted, logic gate 56 will reset the outputs of DFF 52,54 to logic "0" in preparation for the next comparison cycle. According to one example, the data ("D") inputs of latches 52 and 54 are maintained at a logic "high" or "1" value. Depending on the timing of the leading edge transition of the ref_clk and the fb_clk, either a pump_up or pump_down signal results.

In order to reduce the dead zone, delay elements 58 are placed in the reset path of PFD 16 to introduce an approximate amount of delay, which allows the pump_up and pump_down signals to substantially reach steady state DC levels. However, the addition of delay elements 58 increases the power and area consumed by the PFD circuit for each delay element added to the circuit. Thus, adding delay elements 58 may disadvantageously result in increasing overall manufacturing costs. In order to reduce the dead zone, delay elements 58 also exhibit slow output edge rates to introduce the approximate amount of delay into the reset path. Unfortunately, the slow output edge rates may result in noise injection problems, threshold uncertainty, and may also increase input jitter to the PLL loop. Another disadvantage of adding delay elements 58 to PFD circuit 16 is the effect delay elements 58 have on the linear range of the PFD. In particular, the PFD linear range is decreased due to the approximate and variable nature of the delay introduced by each delay element. For example, threshold skews in the delay element may increase the dead zone amount. Moreover, the induced delay may be fixed, yet insufficient, resulting in an inappropriately small linear range.

Figure 5:
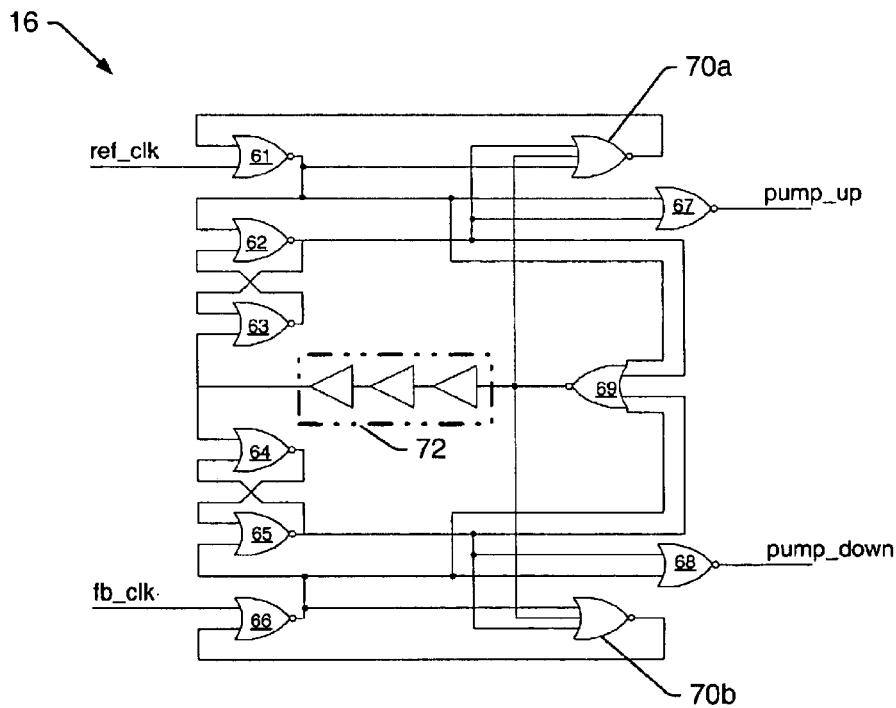
FIG. 5 illustrates another embodiment of a phase frequency detector that reduces the dead zone by adding delay elements in the reset path of the PFD.
Figure 10:
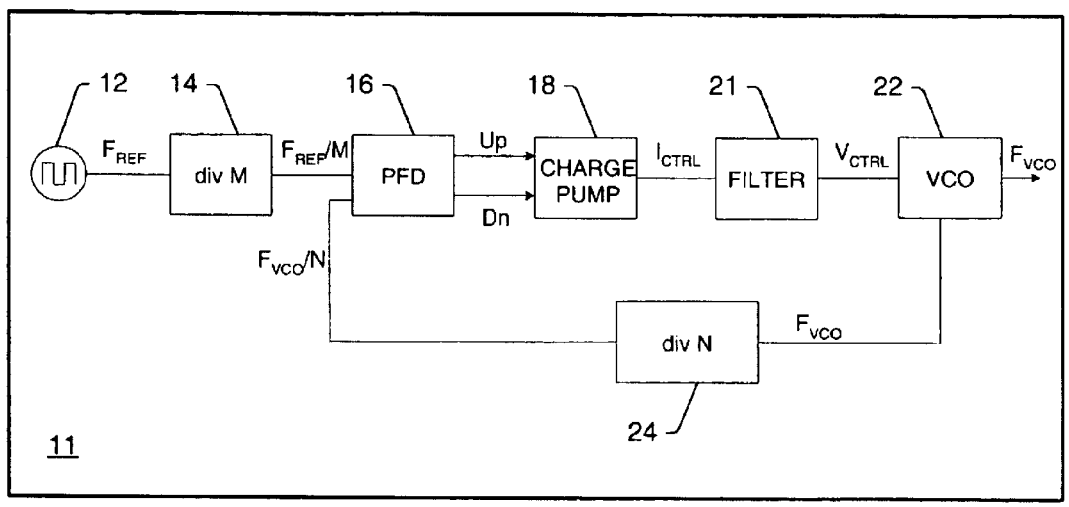
FIG. 10 is a block diagram of a conventional phase lock loop circuit.

FIG. 5 illustrates another embodiment of a conventional phase frequency detector 16 that may be used in PLL circuit 11 of FIG. 10. Such an embodiment is an OR/NOR gate implementation, in one example, commonly called a "9-Gate" PFD. The "9-Gate" PFD includes nine OR/NOR gates, which are shown in FIG. 5, for example, as reference numerals 61–69. In this manner, the reference clock signal ("ref_clk") is coupled to logic gate 61 while the feedback clock signal ("fb_clk") is coupled to logic gate 66. In addition, sets of the logic gates are cross-coupled to form latches, which function similar to latches 52 and 54 of FIG. 4. For example, gates 61–63 and 70a are coupled to function similar to DFF 52, whereas gates 64–66 and 70b are coupled to function similar to DFF 54. Upon the rising edge of the feedback clock signal, if the feedback input to logic gate 66 transitions to a logic high value before the rising edge of the reference clock signal (i.e., fb_clk is leading, or phase advanced), logic gate 68 will output a pump down ("pump_down") signal. Subsequently, the voltage sent to the VCO of PLL circuit 11 will be reduced via the charge pump and the internal clock will be slowed.

Alternatively, upon the rising edge of the reference clock signal, if the reference input to logic gate 61 transitions to a logic high value before the rising edge of the feedback clock signal (i.e., fb_clk is lagging, or phase retarded), logic gate 67 may output a pump up signal ("pump_up"). Subsequently, the voltage sent to the VCO of PLL circuit 11 will be increased via the charge pump in order to speed up the internal clock. Once both corrective output pulses have been asserted, logic gate 69 will reset the latches (i.e., logic gates 61–63, 70a and 64–66, 70b) to a logic low voltage value of "0" in preparation for the next comparison cycle. As noted herein, a logic high voltage value is, relatively speaking, a voltage value of greater magnitude than a logic low voltage value. If a positive voltage reference scenario is applied, then a logic high voltage is closer to the power supply voltage than the logic low voltage.

Though the performance of the 9-Gate PFD shown in FIG. 5 can match the performance of the DFF implemented PFD shown in FIG. 4, the 9-Gate PFD may be harder to balance and may be more susceptible to noise due to its many single ended signals. In addition, the 9-Gate implementation suffers from the same disadvantages as the DFF implementation, such that a number of non-idealities are introduced into the PFD circuit. These non-idealities cause PFD circuit 16 to perform poorly in comparison to the ideal circuit behavior depicted in FIG. 1. For example, delay elements 72 are introduced into the reset path of the PFD circuit to introduce an approximate amount of delay. Similar to the DFF implementation of FIG. 4, added delay elements 72 disadvantageously decrease the linear range of the PFD while increasing the power and area consumed by the circuit.

Figure 6:
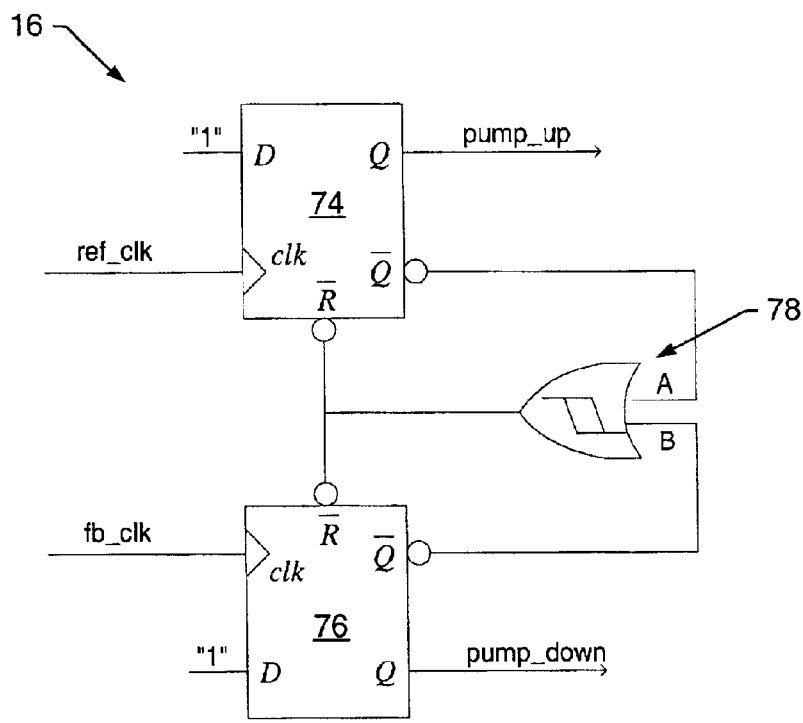
FIG. 6 is a circuit design illustrating a preferred embodiment of a PFD circuit including a logic gate with hysteresis.

FIG. 6 illustrates a preferred embodiment of PFD circuit 16, which avoids the dead zone while maximizing the PFD linear range and minimizing the jitter, power, and silicon area needed for the PFD design. The phase frequency detector 16 of FIG. 6 may be a positive edge-triggered PFD including two latching devices and a reset logic gate. Preferably, the latching devices include two D-type flip-flops (DFF) 74, 76. Alternatively, PFD 16 may be a negative edge-triggered PFD, and/or may include other latches, flip-flops, or any other circuitry that provides a single output in response to a clock, or "set" signal. As shown in FIG. 6, each latch within PFD 16 includes a reset input, a clock input, and a data input. In the case of a positive edge-triggered PFD, the data input of each latch is coupled to a predefined logic high voltage value, such as $V_{CC}$ or a logic "1" value. PFD 16 is configured to receive a first input signal generated by a reference source and sent to PLL circuit 11 of FIG. 10. As such, the first input signal is a reference clock signal having a reference frequency and phase, and is coupled to the clock input of first latch 74. PFD 16 is also configured to receive a second input signal generated by the internal components of PLL circuit 11. In this manner, the second input signal is a feedback clock signal having a feedback frequency and phase, and is coupled to the clock input of second latch 76. Regardless of the structure of latches 74 and 76, it is recognized that latches 74 and 76 function to latch the predefined logic input value (e.g., "1") to an output conductor of the respective latch.

The preferred embodiment of PFD 16 (shown in FIG. 6) functions in a manner similar to the PFD circuit described in reference to FIG. 4. For example, if the reference clock signal transitions before the feedback clock signal, the logic high voltage value tied to the data (D) input will be presented upon the Q output of latch 74. This will cause a pump up signal and, more particularly, a pump up pulse to be output from latch 74. The pump up pulse is asserted as a logic high voltage value for a duration beginning shortly after the leading edge of the reference clock signal. The pump up pulse will remain until latch 74 is reset. Conversely, if the feedback clock signal transitions before the reference clock signal, the logic high voltage value on the data (D) input of latch 76 will be presented on the Q output of latch 76. This will result in a pump down pulse that will last until latch 76 is reset.

Latches 74 and 76 are not reset until reset logic gate 78 produces a reset signal on its output. Once a reset signal is asserted, latches 74 and 76 will reset simultaneously to terminate the pump up and pump down pulses for each clock cycle of the reference clock. In other words, a pump up pulse may be initiated, followed by a pump down pulse. In such a case, the pump up pulse may last longer in duration than the pump down pulse when the reference clock signal precedes the feedback clock signal. The opposite would be true (i.e., pump down pulse would be longer in duration than the pump up pulse) if the feedback clock precedes the reference clock.

Regardless of the scenario, a pump up pulse followed by or preceded with a pump down pulse will exist for each comparison cycle of the reference clock signal and the feedback clock signal (i.e., for each reference clock cycle or for each feedback clock cycle). The duration by which the pump up pulse extends beyond the pump down pulse will denote that a positive accumulation will be registered on the output of the charge pump. In other words, the charge pump may subtract the duration of the pump down logic high voltage value pulse from the duration of the pump up logic high voltage value pulse to achieve a net value for each comparison cycle. The net value may then be added to subsequent net values for a cumulative number of comparison cycles to achieve a final charge pump output voltage. As such, the charge pump output voltage indicates whether the VCO must increase (or decrease) the feedback clock signal frequency (or phase) relative to the reference clock signal. If the final charge pump output voltage is relatively small, for example, the VCO will be instructed to decrease the frequency of the feedback signal. The opposite is true if the final charge pump output voltage is relatively high.

Reset logic gate 78 of FIG. 6 includes hysteresis. In this manner, reset logic gate 78 generates a time delay output signal (i.e., a reset signal) having a pulse width substantially equal to a minimum pulse width associated with first latch 74 and second latch 76. For example, the corrective output pulses (i.e., pump up and pump down pulses) from the first and second latches may have minimum pulse widths when a zero phase offset exists between the reference and feedback clock signals (i.e. when the PFD is in "phase lock"). In addition, a "reset pulse width" may be determined by the amount of time needed for the pump up or pump down pulses to substantially reach steady state, or DC, voltage values. As such, the hysteresis input to reset logic gate 78 allows a corrective pump up and/or a corrective pump down pulse to reach an approximate steady state DC voltage value before reset logic gate 78 switches latches 74 and 76 to a reset state. In this manner, the hysteresis input to reset logic gate 78 provides an appropriate amount of delay in the reset path of the PFD without introducing additional circuit elements, such as inverters, buffers, capacitors, or any other well-known delay techniques.

Figure 7:
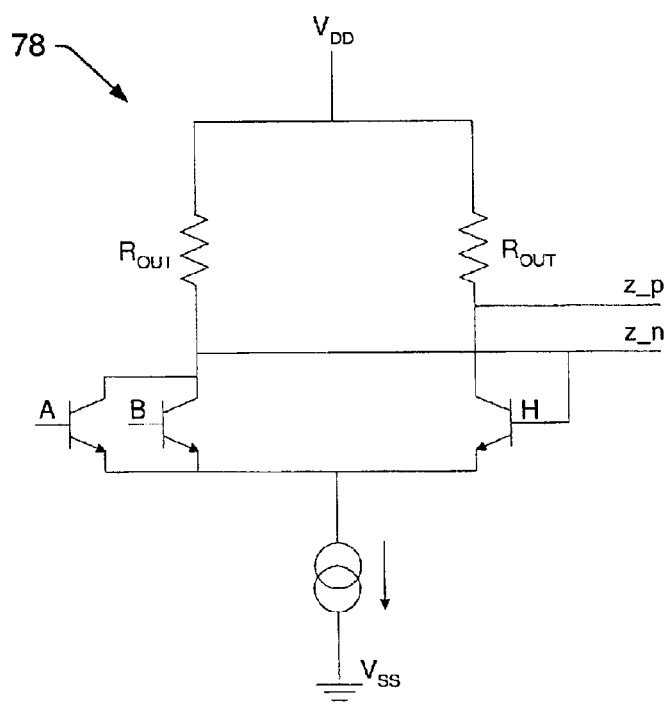
FIG. 7 is a circuit diagram of the hysteresis logic gate of FIG. 6.

FIG. 7 is a simplified circuit diagram illustrating reset logic gate 78 as having an OR/NOR configuration. However, it may be within the scope of the present invention to implement reset logic gate 78 using other logic gates, for example, an AND/NAND gate or any other combination of logic gates, which produces a response similar to reset logic gate 78. As shown in FIG. 7, reset logic gate 78 includes a plurality of transistors (denoted as A, B, and H) and output conductors (denoted as output z_n and output z_p). In particular, output z_n provides a NOR response while output z_p provides an OR response for reset logic gate 78. Similar to a normal OR/NOR gate, the gate of transistor A may be adapted to receive a first complementary output pulse (e.g., Q bar instead of the Q pump up pulse) from first latch 74. In the same manner, the gate of transistor B may be adapted to receive a second complementary output pulse (e.g., Q bar instead of the Q pump down pulse) from second latch 76.

Transistors A and B can be bipolar or MOS transistors. If the transistors are placed in parallel with one another, an OR/NOR logic will follow. In other words, if the gate or base conductor of either transistor A or B receives a logic high voltage value, output z_n will transition to a logic low voltage value representative of a NOR output response.

In addition to transistors A and B, hysteresis transistor H is also provided in the embodiment of FIG. 7. Transistor H receives the z_n output upon its gate or base in somewhat of a feedback fashion. The additional feedback provides a time delay within reset logic gate 78, and is used to provide an inverse or complementary output (i.e., output z_p is complementary to output z_n) for reset logic gate 78. Accordingly, if output z_n demonstrates a logic low voltage value, transistor H will turn off causing the right-hand transistor $R_{OUT}$ to pull output z_p up to a logic high voltage value. In other words, when the transistors are connected as shown in FIG. 7, the two-input reset logic gate operates as a differential amplifier and compares the higher of the input voltages (either A or B) to the voltage input to the gate of transistor H. In this manner, if the higher of the input voltages minus the voltage input to transistor H is positive, output z_p will rise to a high logic level, while at the same time, output z_n will fall to a low logic level. Conversely, if the higher of the input voltages minus the voltage input to transistor H is negative, output z_p will fall to a low logic level and output z_n will rise to a high logic level.

Figure 8:
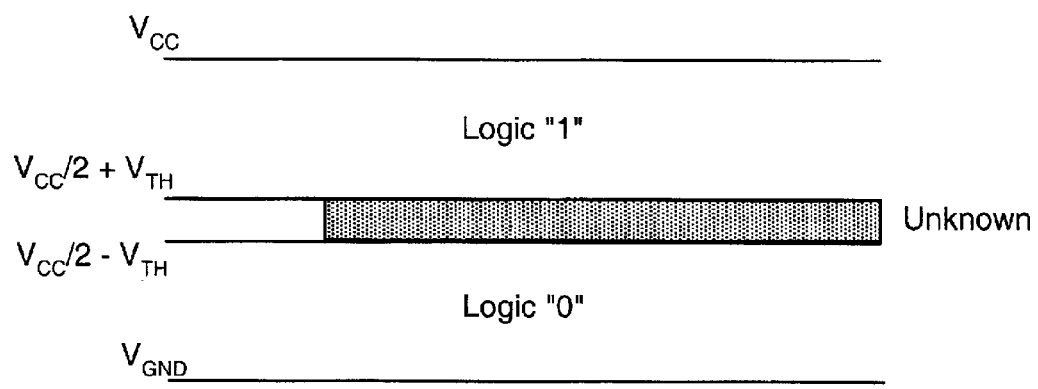
FIG. 8 is a timing diagram of threshold voltages needed to realize logic high and logic low voltages from a conventional CMOS logic gate absent hysteresis.
Figure 9:
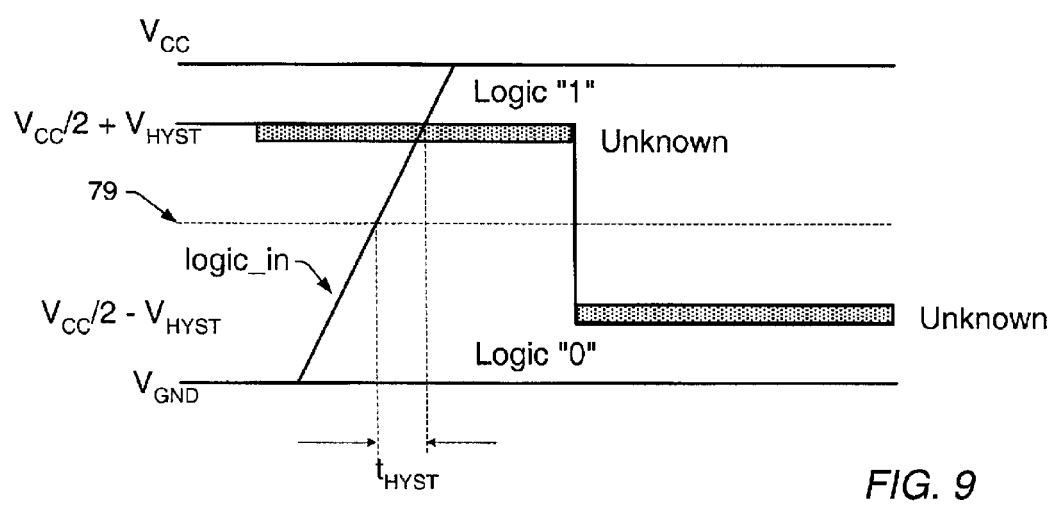
FIG. 9 is a timing diagram of threshold voltages needed to realize logic high and logic low voltages from a logic gate having hysteresis.

As shown in FIGS. 8 and 9, however, an uncertainty region may occur due to the finite gain of the differential amplifier. This uncertainty region, or threshold region (i.e., denoted as 'unknown' region in FIGS. 8 and 9), has a voltage magnitude proportional to the gain of the differential amplifier. In this manner, outputs z_p and z_n may not reach steady state logic levels if the absolute voltage of the higher of the input voltages (i.e., the higher of A or B) minus H is not greater than the voltage magnitude of the threshold region. Instead, outputs z_p and z_n may reach voltage levels that fall somewhere between the high and low logic levels, and thus, may cause latches 74 and 76 to be reset at an inappropriate time, or alternatively, to not be reset at all.

In a reset condition, for example, reset logic gate 78 would receive logic low voltage values on both inputs A and B. This is representative of both a pump up pulse and a pump down pulse during a comparison cycle in which both the reference clock signal and the feedback clock signal are present on PFD 16 (See FIG. 6). If both inputs demonstrate a logic low voltage value, noting that the reference and feedback clock signals are present (one possibly lagging the other), reset logic gate 78 will produce a logic high voltage value at output z_n via pull up characteristics of the left-hand resistor $R_{OUT}$. This is due to transistors A and B being substantially off or in a non-conducting state. In addition, the logic high voltage value on output z_n will cause hysteresis transistor H to turn on, thereby pulling down output z_p to a logic low voltage value.

In the illustrative embodiments of FIGS. 6 and 7, output z_p is used as the output of reset logic gate 78 and is forwarded to the reset bar ($\overline{R}$) input of latches 74 and 76. Sending a logic low voltage value into the $\overline{R}$ inputs of latches 74 and 76 will cause the latches to be reset concurrent with one another. In other words, a reset signal is forwarded to the $\overline{R}$ inputs of latches 74 and 76. Upon transition of the reset signal, latch 76 will transition the pump down signal to a logic low voltage value. At the same time, latch 74 will transition the pump up signal to a logic low voltage value. More specifically, latches 74 and 76 will be reset only after a voltage value input to transistor A or B exceeds the voltage value input to transistor H of reset logic gate 78, thereby denoting that hysteresis has occurred.

As stated above, an uncertainty or threshold region may occur due to the finite gain of the differential amplifier (i.e., reset logic gate 78 of FIG. 6). The importance of using a hysteresis transistor (i.e., transistor H of FIG. 7) in a feedback arrangement is depicted in the comparison between the trip-point (or threshold voltage) graphs of FIGS. 8 and 9. A CMOS trip-point characteristic is shown in FIG. 8 for a typical CMOS OR/NOR logic gate without hysteresis. A typical CMOS OR/NOR logic gate without hysteresis would drive the input of transistor H to a threshold voltage value ($V_{TH}$) that is approximately half way between the DC logic high and logic low voltage values. The logic swing is chosen so that the absolute voltage difference between the higher of inputs A and B and the voltage input to transistor H is greater than the voltage magnitude of the threshold region. In this manner, the z_p and z_n outputs of the gate will be driven to high and low logic levels depending on the input conditions.

For example, a CMOS logic gate without hysteresis can produce a logic high or logic "1" voltage value if one or more inputs exceed a midpoint voltage minus a threshold voltage ($V_{CC}/2-V_{TH}$). In addition, a logic low or logic "0" output can be realized if one or more inputs to the logic gate extend below the midpoint voltage plus a threshold voltage ($V_{CC}/2+V_{TH}$). While the normal CMOS logic gate architecture quickly responds to slight variations in the input voltages around $V_{CC}/2$, an unfortunate aspect of such a design is its speed of operation. In almost all designs, high speed CMOS architecture is crucial to meeting device specification goals.

However, a logic gate having hysteresis demonstrates a trip-point characteristic (shown in FIG. 9), which is contrary to the conventional goal of high-speed operation. As such, the hysteresis logic gate having trip-point characteristics, as shown in FIG. 9, consume considerably less power than the logic gate having trip-point characteristics, as shown in FIG. 8. As noted is FIG. 8, the region around the midpoint separated by one threshold voltage ($V_{TH}$) causes power consumption whenever the input voltages to the logic gate cross within the unknown region. The amount of crossing is substantial since every voltage swing will, by its nature, traverse the unknown region shown in FIG. 8.

Conversely, the hysteresis logic gate trip-point characteristics of FIG. 9 purposely separate the logic high or logic "1" region from the logic low or logic "0" region. It is not until the input voltages (denoted as logic_in) extend above $V_{CC}/2+V_{HYST}$ that a logic "1" output will be realized. Additionally, it is not until the logic_in input extends below $V_{CC}/2-V_{HYST}$ that a logic "0" output will be realized. In the interim between the logic "1" and logic "0" outputs, the hysteresis logic gate consumes very little power and, more importantly, the output of the hysteresis logic gate will not transition.

Reference numeral 79 compares a normal trip-point of a conventional logic gate to a trip point of a logic gate having hysteresis (i.e., reset logic gate 78). If the logic_in input were to exceed the conventional trip-point level (denoted as numeral 79), a logic "1" output would be realized. However, by connecting the input of hysteresis transistor H to the output of reset logic gate 78, as shown in FIG. 7, the trip-point is extended further upward to $V_{CC}/2+V_{HYST}$, thereby causing an additional time delay of $t_{HYST}$, as shown in FIG. 9. This time delay is the time needed for the logic_in input to ramp up to the higher trip-point or threshold voltage associated with the added hysteresis. The added hysteresis is due to the input to transistor H varying between high and low logic levels, which effectively changes the nominal threshold of the reset logic gate depending on the current output state of the reset logic gate (i.e., depending on whether output z_n is at a logic high or logic low level in the example provided in FIG. 7).

In other words, the output of the hysteresis reset logic gate is determined in a manner similar to the conventional logic gate without hysteresis (i.e. the voltage values of the higher of A or B minus H determines the output of the logic gate). However, the voltage value input to transistor H is not fixed and instead changes to reflect the z_n output. It is the change in the voltage value input to transistor H, along with the gain of the differential amplifier, which determines the amount of hysteresis introduced by the reset logic gate. Thus, tying the input of transistor H directly to the output of the reset logic gate (e.g., to the z_n output in the case of FIG. 7) produces the appropriate amount of hysteresis in which to allow the inputs A and B to reach final DC voltage values before the reset logic gate switches its output. In other words, the amount of hysteresis introduced by the reset logic gate is substantially equal to an amount of time needed for the pump down and pump up signals to achieve steady state before the output of the reset logic gate sends a reset signal to the reset inputs of the pair of latches 74,76. The amount of hysteresis can be adjusted by scaling the size (preferably the width) of transistor H.

The conventional design shown in FIG. 8 for high-speed CMOS devices has a significant disadvantage in the present design. As threshold voltages decrease with advances in processing technology, the gap labeled "unknown" in FIG. 8 will decrease; however, the relative output transition speed of the logic gate will increase. The amount of increase will cause the output of the conventional logic gate to transition fairly quickly relative to inputs placed on that logic gate. As such, the latches of the conventional PFD will be reset shortly after the last clocking signal transition is placed on the clocking input of the last-initiated latch. In the embodiment of FIG. 4, for example, if the reference clock signal is leading the feedback clock signal, reset will occur once the last clocking signal leading edge is placed onto the clocking input of the last-initiated latch (i.e., the feedback clock signal transition placed on latch 54). This will cause a pump down pulse to be initiated on the Q output of latch 54 similar to the pre-existing pump up pulse previously initiated by the reference clock leading edge. However, if logic gate 56 is fairly fast, the logic low Q bar output will cause a quick reset signal on the output of the logic gate, thereby resetting the Q output of the last-initiated latch before that output has a chance to transition to its full steady state logic high or logic low output.

On the other hand, FIG. 9 illustrates the behavior of the hysteresis reset logic gate of the present invention. The hysteresis reset logic gate includes a first voltage threshold ($V_{CC}/2+V_{HYST}$) and a second voltage threshold ($V_{CC}/2-V_{HYST}$), which is substantially different from the first voltage threshold. In this manner, a logic "1" will not be recognized until the logic_in (i.e., A or B input voltage value) reaches a higher limit, or first voltage threshold. Similarly, a logic "0" will not be recognized until the logic_in reaches a lower limit, or second voltage threshold.

In one example, the hysteresis reset logic gate may be constructed using CML differential logic. In such an example, an input voltage value greater than approximately $V_{CC}-0.75V_S$ may produce a logic "1", while an input voltage value less than approximately $V_{CC}-0.25V_S$ may produce a logic "0". In an alternative example, the hysteresis reset logic gate may be constructed using CMOS devices. In a CMOS implementation, a value of about 0.6 $V_{CC}$ to near $V_{CC}$ may represent a logic "1", while a value of about 0.4 $V_{CC}$ to near 0.0 may represent a logic "0". In this manner, the hysteresis loop of transistor H induces a separation between the first and second voltage thresholds of the hysteresis reset logic gate. The difference between the first and second voltage thresholds prevents the reset logic gate from resetting the first and second latches until output pulses from the first and second latches (i.e., pump up and pump down pulses) approximately reach voltage threshold values.

Use of the hysteresis loop within reset logic gate 78 provides many advantages. First, the added hysteresis or delay ensures that a reset will not occur too early. Second, the pump up and pump down signals will transition to their full DC value or steady state before a reset occurs. This will allow the PFD to avoid the dead zone and ensure zero phase offset at the phase lock point of the PLL. Third, the PFD will sustain linearity throughout a linear range extending between about +/−2π. Fourth, by adding hysteresis within the reset logic gate, additional delay elements with corresponding arbitrary delay amounts is avoided in the present PFD. Lastly, the present PFD avoids the higher power consumption of conventional delay elements or logic gates that have little, if any, separation between the logic high and logic low trip-points. By separating those trip-points using the hysteresis loop of the present design, the overall logic gate power consumption can be significantly reduced. Power consumption is also reduced by eliminating the need for power-consumptive passive or active delay elements at the output of the reset logic gate.

All of the features of the present PFD are preferably implemented within a conventional PLL circuit. FIG. 10 illustrates PLL circuit 11 as including PFD 16, charge pump 18, filter 21, voltage-controlled oscillator (VCO) 22, and feedback frequency divider 24. Thus, PLL circuit 11 may be described as a charge pump PLL. Of course, the PFD of the present invention may also be utilized in a delay-locked loop (DLL), a data transmitter, a data receiver, or in any other clocked circuit known in the art. The PLL circuit receives an input reference signal, denoted as reference clock signal ($F_{REF}$), from reference frequency source 12. Popular frequency sources may include RC oscillators or LC oscillators, which are fairly stable at relatively high frequencies. However, a crystal oscillator may be used as reference frequency source 12 in systems that require greater stability at even higher frequencies. Thus, reference frequency source 12 may be any source capable of generating a stable reference signal at a known frequency. The input reference signal, $F_{REF}$, includes frequency and phase information. Optionally, reference frequency divider 14 may be included to divide the frequency of the input reference signal by an integer M to allow the use of higher frequency reference sources.

As shown in FIG. 10, PLL circuit 11 accepts two input signals, e.g., a reference input and a feedback input, and generates an output pulse. Similar to the reference signal, the feedback signal $F_{VCO}$ includes frequency and phase information. Phase frequency detector 16 compares the reference signal ($F_{REF}$) to the feedback signal ($F_{VCO}$) of the PLL circuit to generate a corrective output pulse (i.e., pump up or pump down pulse) in response to the phase difference between the reference and feedback signals. In this manner, the corrective output pulse is used to "phase lock" the feedback signal to the reference signal.

The pump up and pump down pulses are passed through charge pump 18 and filter 21 to generate a control voltage ($V_{CTRL}$), which controls VCO 22. VCO 22 converts the voltage information into output frequency $F_{VCO}$. The amount of voltage resulting from the cumulative pump up and pump down pulses will be registered as a net, or final, voltage value at a particular moment in time. The net voltage value quantity will cause a corresponding oscillation at the output of the VCO. Thus, if the amount (i.e., pulse width or duration) of the pump up pulse exceeds the amount of the pump down pulse for each comparison cycle, a positive net voltage value will represent a positive net pump up voltage quantity fed to the VCO. The VCO will then increase the frequency of the feedback signal, shown as $F_{VCO}$. Conversely, if the pump down voltage nets greater than the pump up voltage of each pulse in the comparison cycle, the VCO will decrease the frequency of the feedback signal.

The VCO output frequency is then sent back via a negative feedback loop to the feedback input of PFD 16. Optionally, feedback frequency divider 24 may be included to divide the output frequency from the VCO (by an integer N) in the feedback loop before entering the PFD. In this manner, feedback frequency divider 24 may allow additional flexibility in the PLL design, such that the VCO output frequency may be modulated by $F_{VCO}=(N/M)F_{REF}$.

In response to the pump up and pump down pulses from PFD 16, charge pump 18 generates phase error correction pulses to change the frequency of the VCO output signal. In one example, charge pump 18 includes a current source and a current sink. The current source and current sink work together to "pull" the filter output voltage ($V_{CTRL}$) up or down, respectively, by providing the appropriate current signal ($I_{CTRL}$) to filter 21. The current signal, $I_{CTRL}$, produced by the charge pump is proportional to the output pulse generated by PFD 16. Alternatively, pump 18 may be a voltage pump, in which case pump 18 may generate a voltage signal proportional to the output pulse of PFD 16.

Filter 21 is typically a low pass filter, and preferably, filter 21 is a second order lead/lag filter. However, filter 21 may be any type of filter which "smoothes" the phase error correction pulses into a nearly DC response. When pump 18 is a charge pump, filter 21 integrates the phase frequency detector and charge pump pulses to convert the current control signal, $I_{CTRL}$, into a DC control voltage, $V_{CTRL}$. However, filter 21 may only provide a filtering function when pump 18 is a voltage pump, which already provides a voltage control signal. Voltage-controlled oscillator 22 converts the control voltage from the filter into an output signal having a frequency and phase. Subsequently, the output frequency signal from the VCO is fed back to the clock input of the second latch (i.e., latch 76 of FIG. 6). In this manner, the control voltage generated by the PFD, charge pump, and filter adjusts the VCO frequency up or down until the phases of the reference and feedback signals are substantially aligned.

Figure 11:
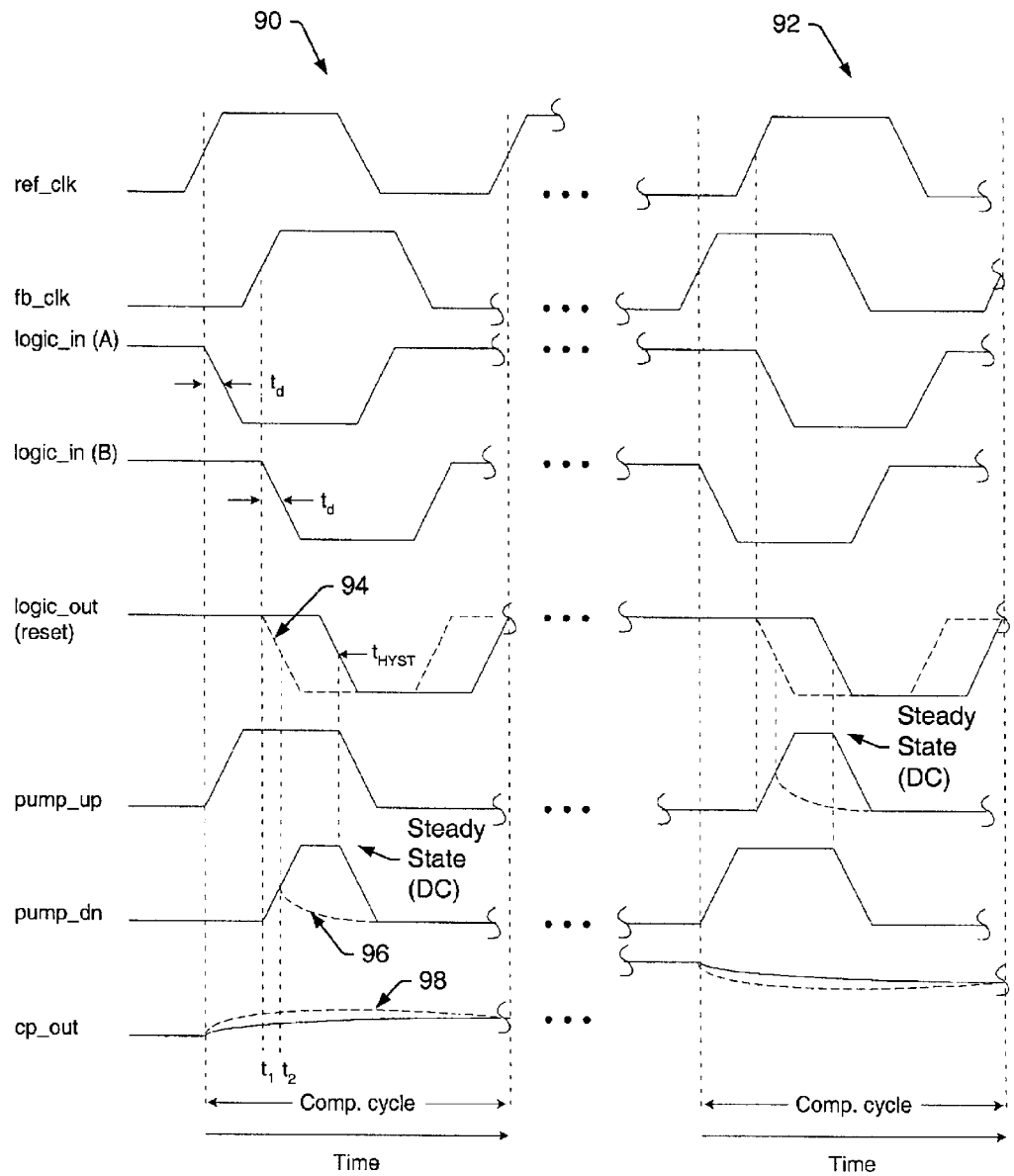
FIG. 11 is a timing diagram of the signals input to the PFD latches (reference clock signal and feedback clock signal), the signals sent to and from the logic gate, the signals output from the PFD latches (pump_up and pump_down), and the charge pump output resulting from cumulative pump up and pump down pulses compared with one another.

Referring to FIG. 11, timing details of the present PFD are shown. When viewed in conjunction with FIG. 6, FIG. 11 illustrates the delay imparted at the output of reset logic gate 78. The timeline depicted in FIG. 11 can be described first in terms of the feedback clock signal lagging the reference clock signal, where there is an overall pump up condition as shown by timeline 90. Alternatively, the timeline can be described in terms of the feedback clock signal leading the reference clock signal to produce a net pump down condition as shown by timeline 92.

In the timeline condition of producing a net pump up value (timeline 90), the reference clock leads the feedback clock by an undefined amount of time. After a defined delay, denoted as $t_d$, through latches 74 and 76 (FIG. 6) the Q bar output from each latch produces a logic low value upon the "A" and "B" inputs of logic gate 78 (FIG. 6). Thus, the positive edge triggered clocking inputs cause a negative edge triggered transition at the Q bar outputs of latches 74 and 76 (with a defined propagation delay, $t_d$, through the latches).

If reset logic gate 78 did not include hysteresis transistor H, the output of the reset logic gate would respond to the logic low transitions of it's inputs much earlier than if the reset logic gate included hysteresis transistor H. Reference numeral 94 is shown in phantom to depict the downward transition that would occur (if reset logic gate 78 did not include hysteresis transistor H) when the second input to the reset logic gate transitions downward at time $t_1$. As indicated by transition line 94, the reset may begin at time $t_1$ and may actually occur at time $t_2$, at approximately the midpoint voltage level of the reset logic gate output signal (denoted as logic_out). However, the reset time $t_2$ may occur too soon in the case that reset logic gate 78 does not include hysteresis transistor H. For example, if the pump down pulse has just begun, or not yet begun at time $t_2$, the pump down pulse may never transition to its final steady state or DC value. Instead, the pump down pulse may simply fail to transition, or may transition slightly upward before falling again, as shown by phantom line 96.

In order to detect a true cumulative pump up or pump down duration and avoid the dead zone problem, it is important that the last corrective output pulse within the comparison cycle (denoted as Comp. Cycle in FIG. 11) transition to a steady state value before reset logic gate 78 resets latches 74 and 76. Otherwise, all that will be measured is the pump up value with no corresponding pump down value (or vice versa), which would mitigate the extensive pump up readings near, for example, the lock point where the reference clock and feedback clock are at approximately the same frequency and phase. In the lock point range, a dead zone will occur due to the deadened pump down signal relative to the pump up signal if, indeed, hysteresis is not added to the output signal (i.e., logic_out transition) of the reset logic gate.

The dead zone is most prevalent near the lock point and, as shown in the charge pump output (denoted as cp_out in FIG. 11), can occur as shown by phantom line 98. To avoid dead zone conditions, hysteresis is induced into reset logic gate 78 to forestall reset at time $t_2$ and, more importantly, to allow the last output pulse or signal (e.g., the pump down pulse in timeline 90) to transition to its final steady state value. Such a steady state value can be reached due to the amount of time, $t_{HYST}$, introduced by hysteresis transistor H.

The waveforms showing a net pump up condition (reference number 90) equally apply to a net pump down condition (reference number 92). By forestalling the reset signal (i.e., the logic_out signal) and, therefore, forestalling resetting of the latches, the last output pulse (e.g., the pump up pulse in timeline 92) is afforded an opportunity to transition to its final steady state value so that both output pulses can be netted against one another for purposes of input to the charge pump.

It will be appreciated to those skilled in the art having the benefit of this disclosure that this invention is believed to provide a phase frequency detector, which may solve the dead zone problem while maximizing the linear range of the PFD and minimizing jitter, power, and area over previous methods. Further modifications and alternative embodiments of various aspects of the invention will be apparent to those skilled in the art in view of this description. For example, though the PFD of the present invention may be constructed using either CML or CMOS logic, one skilled in the art would recognize that any logic family including, but not limited to, ECL, differential FET, NMOS, or PMOS may also be used. Furthermore, though the PFD of the present invention may be used in systems, such as frequency synthesizers, which incorporate PLL devices, one skilled in the art would recognize that the PFD of the present invention may be used in all types of communication devices and systems. Moreover, though the PFD of the present invention may be described in the context of a DFF implementation, a 9-Gate PFD implementation may also be within the scope of the present invention. Therefore, it is intended that the following claims be interpreted to embrace all such modifications and changes and, accordingly, the specification and drawings are to be regarded in an illustrative rather than a restrictive sense.

What is claimed is:

1. A detector, comprising:
   a first input conductor coupled to a first latch and adapted to receive a reference clock signal;
   a second input conductor coupled to a second latch and adapted to receive a feedback clock signal;
   a first input conductor coupled to the second latch, wherein the first output conductor is adapted to receive a pump down signal that transitions to a logic high voltage if a leading edge of the feedback clock signal precedes a leading edge of the reference clock signal;
   a second output conductor coupled to the first latch, wherein the second output conductor is adapted to receive a pump up signal after the pump down signal is received by the first output conductor;
   a logic gate having no more than two inputs and one output, wherein the inputs of the logic gate are coupled to reset inputs of the first and second latches, wherein the output of the logic gate is coupled to reset inputs of the first and second latches, and wherein the logic gate is adapted to forestall transition of the pump down signal to a logic low voltage until after a transition of the pump up signal reaches a steady state logic high voltage value for each cycle of the reference clock signal; and
   a reset path extending between the output nodes and reset inputs of the first and second latches, wherein the reset path comprises no delay elements other than the logic gate.

2. The detector as recited in claim 1, wherein the first latch is coupled to receive the reference clock signal and to generate the pump up signal, and wherein the second latch is coupled to receive the feedback clock signal and to generate the pump down signal.

3. The detector as recited in claim 2, wherein the first and second latches comprise D-type flip flops having input terminals coupled to receive a predefined logic high voltage value.

4. The detector as recited in claim 1, further comprising:
   wherein the second output conductor is adapted to receive a pump up signal that transitions to a logic high voltage value if the leading edge of the feedback signal lags the leading edge of the reference clock signal;
   wherein the first output conductor is adapted to receive a pump down signal after the pump up signal is received by the second output conductor; and
   wherein the logic gate is coupled to forestall transition of the pump up signal to a logic low voltage unitil after a transition of the pump down signal reaches the steady state logic high voltage value for each cycle of the feedback clock signal.

5. A detector comprising:
   a first input conductor coupled to a first latch and adapted to receive a reference clock signal;
   a second input conductor coupled to a second latch and adapted to receive a feedback clock signal;
   a first output conductor coupled to the second latch, wherein the first output conductor is adapted to receive a pump down signal that transitions to a logic high voltage if a leading edge of the feedback clock signal precedes a leading edge of the reference clock signal;
   a second output conductor coupled to the first latch, wherein the second output conductor is adapted to receive a pump up signal after the pump down signal is received by the first output conductor;
   a logic gate coupled to output nodes of the first and second latches, wherein the logic gate is adapted to forestall transition of the pump down signal to a logic low voltage until after a transition of the pump up signal reaches a steady state logic high voltage value for each cycle of the reference clock signal, and wherein the logic gate comprises:
      a first and second pair of transistors; and
      a third transistor having an input coupled to an output of the first and second pair of transistors; and
   a reset path extending between the output nodes and reset inputs of the first and second latches, wherein the reset path comprises no delay elements other than the logic gate.

6. The detector as recited in claim 5, wherein an input of the first transistor is coupled to receive a first signal having a logic value opposite the pump up signal, wherein an input of the second transistor is coupled to receive a second signal having a logic value opposite the pump down signal, and wherein an output of the third transistor is a reset signal which, when activated, transitions the pump down signal to a logic low voltage during each cycle of the reference clock signal.

7. The detector as recited in claim 6, wherein the first latch is coupled to receive the reference clock signal, wherein the second latch is coupled to receive the feedback clock signal, and wherein the reset signal is forwarded to the reset inputs of the first and second latches and, upon transition of the reset signal, the second latch transitions the pump down signal to a logic low voltage value.

8. The detector as recited in claim 7, wherein the third transistor is coupled to delay the transition of the reset signal only by an amount of time needed for the pump down signal and the pump up signal to reach the steady state logic high voltage value.

9. A phase-locked loop, comprising:
   a detector comprising a logic gate having a transistor that imputes hysteresis into an output of the logic gate, wherein the detector is adapted to (i) produce a pump down signal if the detector receives a feedback clock signal before receiving a reference clock signal, wherein the detector forestalls termination of the pump down signal until after a pump up signal, which is produced after the pump down signal, achieves a steady state voltage value;

(ii) produce a pump up signal if the detector receives the feedback clock signal after receiving the reference clock signal, wherein the detector forestalls termination of the pump up signal until after a pump down signal, which is produced after the pump up signal, achieves a steady state voltage value; and a charge pump configured to subtract the duration of the pump down signal and the pump up signal and produce a net voltage value that controls the feedback clock signal to match in frequency or phase the reference clock signal.

10. The phase-locked loop as recited in claim 9, wherein the charge pump sums the net voltage value for each cycle of the reference clock signal.

11. The phase-locked loop as recited in claim 9, wherein the charge pump is configured to subtract only the steady state voltage value of the pump down signal and the steady state voltage value of the pump up signal for the duration of the pump down signal and the pump up signal.

12. The phase-locked loop as recited in claim 9, wherein the output of the logic gate is coupled to reset inputs of a pair of latches coupled to produce the pump down and pump up signals, respectively, and wherein the amount of hysteresis is equal to an amount of time needed for the pump down signal and the pump up signal to achieve steady state before the output of the logic gate sends a reset signal to the reset inputs of the pair of latches.

13. The phase-locked loop as recited in claim 12, wherein the reset signal occurs at a time approximately equal to the amount of hysteresis after which the detector receives both the feedback clock signal and the reference clock signal.

14. The phase-locked loop as recited in claim 12, wherein the output of the logic gate is directly connected to the reset inputs of the pair of latches.

15. The phase-locked loop as recited in claim 12, wherein the detector further comprises a pair of output conductors coupled between the pair of latches and the logic gate, and wherein the pair of output conductors are precluded from coupling to delay elements other than the pair of latches and the logic gate.

16. A method of reducing a dead zone of a circuit which detects a phase or frequency difference between a reference clock signal and a feedback clock signal, comprising:

generating a pump up or pump down signal depending on whether the feedback clock signal lags or leads, respectively, the reference clock signal;

generating a reset signal, which is delayed only by an amount produced by a logic gate that receives the pump up and pump down signals; and achieving a steady state voltage value of the pump up and pump down signals before initiating a reset condition upon a pair of latches which produce the pump up and pump down signals, wherein said achieving comprises imparting the reset signal to reset inputs of the pair of latches.

17. The method as recited in claim 16, wherein said imparting a reset signal occurs for each cycle of the reference clock signal or the feedback clock signal.

18. The method as recited in claim 16, wherein said generating a reset signal eliminates a need for imparting additional delay to an input of the logic gate or to the reset inputs of the pair of latches.

19. The method as recited in claim 16, wherein said imparting the reset signal forestalls the initiation of the reset condition by an amount of time equal to an amount of time needed for the pump up and pump down signals to reach the steady state voltage value.

* * * * *

UNITED STATES PATENT AND TRADEMARK OFFICE
CERTIFICATE OF CORRECTION

PATENT NO. : 6,771,096 B1
DATED : August 3, 2004
INVENTOR(S) : Meyers et al.

It is certified that error appears in the above-identified patent and that said Letters Patent is hereby corrected as shown below:

Column 15,
Line 36, please delete "a first input" and substitute therefor -- a first output --.
Line 47, please delete "to reset inputs" and substitute therefor -- to output nodes --.

Column 16,
Line 10, please delete "unitil" and substitute therefor -- until --.

Signed and Sealed this

Seventh Day of December, 2004

JON W. DUDAS
*Director of the United States Patent and Trademark Office*